United States Patent [19]

Larson

[11] 4,425,515

[45] Jan. 10, 1984

[54] METHOD AND MEANS TO MINIMIZE RISETIME OF A MICROWAVE PULSE MODULATED SIGNAL FROM A FREQUENCY MULTIPLIER CIRCUIT

[75] Inventor: Ronald K. Larson, San Jose, Calif.

[73] Assignee: Hewlett-Packard Company, Palo Alto, Calif.

[21] Appl. No.: 321,503

[22] Filed: Nov. 16, 1981

[51] Int. Cl.$^3$ .......................... H03K 3/33; H03K 5/12
[52] U.S. Cl. .................................... 307/268; 307/263; 307/271; 307/319; 333/20; 333/218
[58] Field of Search .............. 307/263, 268, 271, 281, 307/320, 578, 319; 333/20, 218; 328/15, 16, 32

[56] References Cited

U.S. PATENT DOCUMENTS

| | | | |
|---|---|---|---|
| 3,311,812 | 3/1967 | Geiszler et al. | 333/218 |
| 3,358,215 | 12/1967 | Swan | 307/320 |
| 3,676,708 | 7/1972 | Uchida | 307/263 |

Primary Examiner—John Zazworsky
Attorney, Agent, or Firm—Edward Y. Wong; Douglas L. Weller

[57] ABSTRACT

A method is provided which minimizes the risetime of a pulse modulated microwave signal propagated through a frequency multiplier circuit which has an input blocking capacitor. The circuit is conditioned by injecting a pulse which charges the blocking capacitor to its steady state value. When a subsequent pulse modulated microwave signal is sent through the frequency multiplier circuit, there is no delay in risetime associated with charging the blocking capacitor of the frequency multiplier circuit.

9 Claims, 23 Drawing Figures

METHOD AND MEANS TO MINIMIZE RISETIME OF A MICROWAVE PULSE MODULATED SIGNAL FROM A FREQUENCY MULTIPLIER CIRCUIT

BACKGROUND OF THE INVENTION

This invention relates to minimizing the risetime of a pulsed microwave output signal. More specifically, the preferred embodiment of the invention minimizes the output risetime of a microwave signal generated by a YIG-tuned frequency multiplier (YTM) which has adverse input capacitance tending to degrade the risetime of the generated output. The YTM, for instance, may be the source for the output of a very broadband signal generator, such as one having a range 2 GHz to 26.5 GHz. As part of such a broadband signal generator, the YTM source must meet certain design goals. For example:

1. The output power of the source must be accurately calibrated and metered during pulse, continuous wave, and amplitude modulations;
2. The output power has to be optimal; this is especially important in the higher microwave frequency ranges, e.g., 18 GHz–26.5 GHz, or K-band, where transmission losses are correspondingly greater; and
3. When the microwave signals are pulse modulated, each microwave pulse must have a short risetime, for example, on the order of 50 nanoseconds or less.

In the prior art, a YIG-tuned step recovery diode multiplier is often used for generating high frequency signals and for achieving some of these goals. These high frequency signals are in K-band or higher and are generally pulse modulated. To pulse modulate these signals in the prior art several methods are used; the following approaches represent some of these methods.

Figure 1:
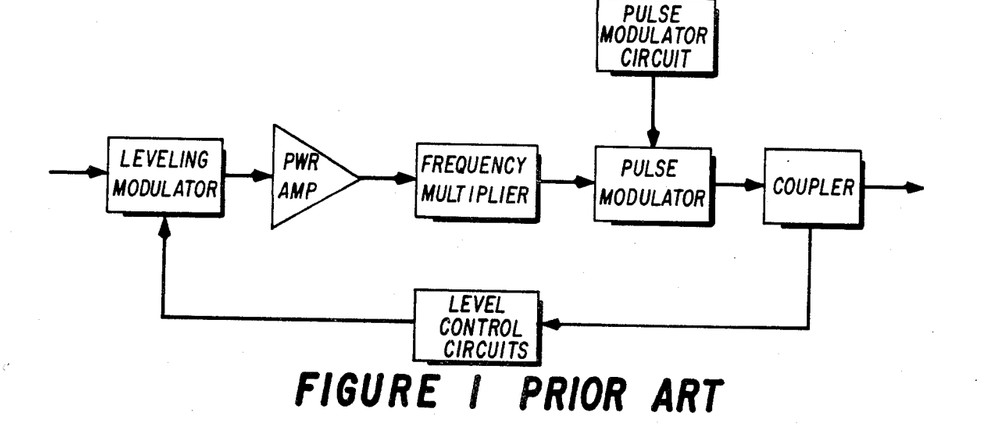
FIG. 1 shows a prior art method which pulse modulates a signal after frequency multiplication.

Post-multiplication Modulation:

This prior art approach pulse modulates a signal after frequency multiplication. This method is illustrated in FIG. 1. The advantage of this system is that microwave pulses of the modulated signal have a very short risetime, i.e., a risetime on the order of 10 to 15 nanoseconds, typically. Several disadvantages, however, are apparent in this method. One disadvantage is that the pulse modulator must be very broadband; such a modulator is difficult and expensive to design. Additionally, pulse modulation at high frequency, e.g., K-band, is very inefficient, leading to very high power loss when the modulator operates at these frequencies. Furthermore, the pulse modulator presents a varying load impedance to the frequency multiplier, thus introducing distortion to the microwave pulse.

Figure 2:
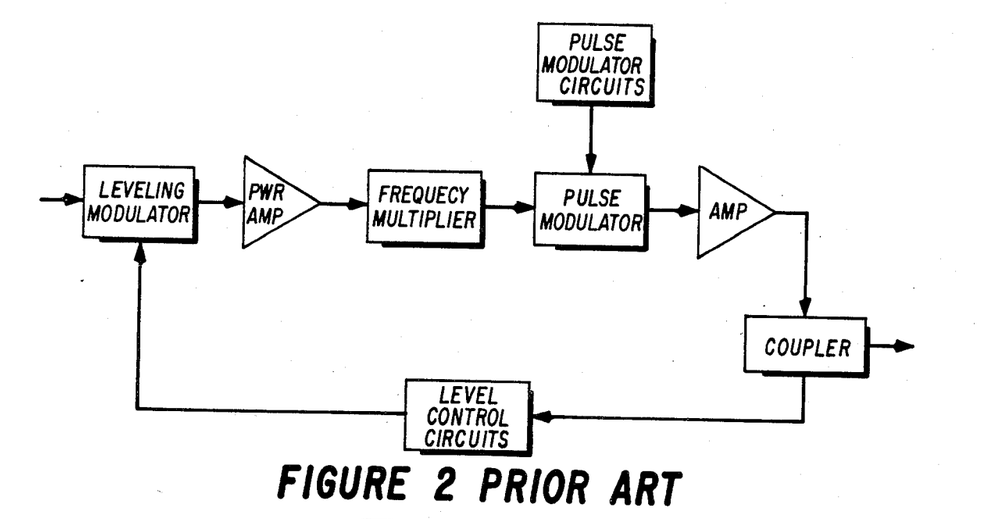
FIG. 2 shows a prior art method which amplifies a signal after post-multiplication modulation of a signal.

Post-multiplication Modulation and Amplification:

Another system is shown in FIG. 2. This system is identical to the one in FIG. 1 with the addition of an amplifier. This system has a short microwave pulse risetime (10 to 15 nanoseconds) and high power output; however, the amplifier following the pulse modulator is required to operate over the entire frequency range. Because of the difficulties in designing a high frequency broadband amplifier, such an amplifier would be unfeasible. One method used to circumvent the design difficulties of the amplifier is to use a K-band amplifier and electromechanical switches to bypass the amplifier in all frequencies except K-band, viz., 18 GHz–26.5 GHz. In this way, the output signal is amplified in the frequency range most needed. This scheme, however, presents additional difficulties: (a) switching time is slow when switching into K-band; and (b) when a sweeping signal generator is used, the switch may be required to switch many times per second, thus resulting in an early failure of the switch.

Figure 3:
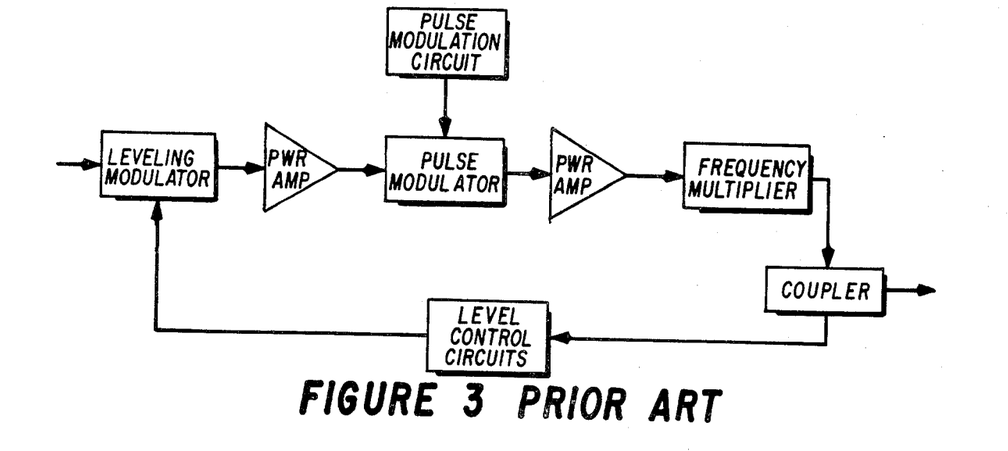
FIG. 3 shows a prior art method which modulates a signal before frequency multiplication.

Pre-multiplication Modulation:

An alternate system is to pulse modulate the signal before multiplying the frequency. This is shown in FIG. 3. In this system, the only components which must be broadband are the frequency multiplier, the detector, and the coupler. All other microwave components operate over a much narrower frequency range, that is, in the same frequency range as the premultiplied microwave input frequency. Thus, these components are relatively cheap and easy to design. The disadvantage of this system is that the frequency multiplier distorts the microwave pulse. The risetime of the microwave output pulse is on the order of 150 nanoseconds. This microwave pulse distortion and long risetime is primarily caused by the frequency multiplier's input D.C. blocking capacitance being charged to its steady state voltage.

The present invention has been designed particularly to reduce the degradation in risetime caused by capacitance, such as that found in the third modulation method discussed. It has also been designed generally to avoid the disadvantages of the prior art methods.

SUMMARY OF THE INVENTION

In accordance with the preferred embodiment of the present invention, the risetime of a pulse modulated microwave signal propagated through a frequency multiplier circuit which has an input blocking capacitor is minimized. The circuit is conditioned by injecting a pulse into it. This injected pulse charges the blocking capacitor to a steady state value. When a subsequent pulse modulated microwave signal is passed through the frequency multiplier circuit, little or no increase in or degradation of, risetime associated with charging the blocking capacitor of the circuit will result.

BRIEF DESCRIPTION OF THE DRAWINGS

FIGS. 4–7D illustrate prior art clamping circuits and their related waveforms which are used to model the input circuitry of a YIG-tuned frequency multiplier (YTM).

FIGS. 8–9D illustrate a circuit with pulse injection in accordance with the present invention and its related waveforms.

DESCRIPTION OF THE PREFERRED EMBODIMENT

Figure 14:
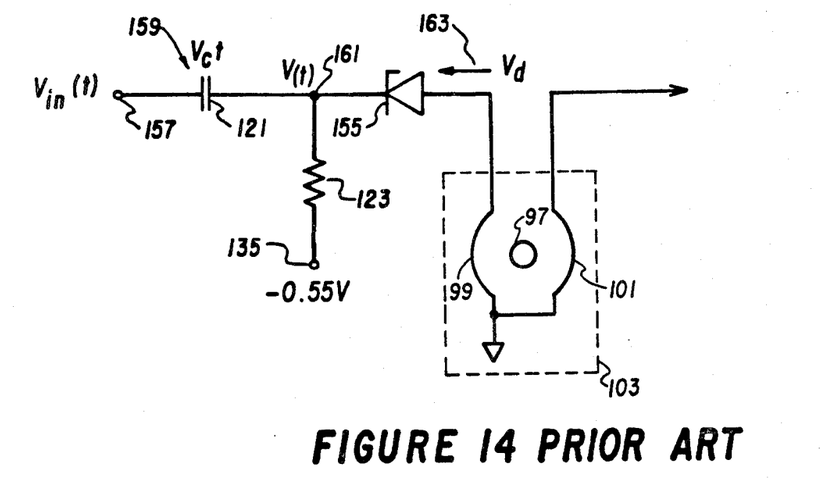
FIG. 14 shows a diagram of a prior art YTM using the clamping circuit of FIG. 6.

The YIG-tuned multiplier (YTM) is a frequency multiplying device. As shown in FIG. 14, in a typical prior art YTM, an input RF voltage 157 is applied to a step recovery diode (SRD) 155 which is operated in its non-linear region. The resulting current through a coupling inductance, L1 99, is rich in harmonics. The YIG sphere 97 acts as a magnetically-tuned circuit which band-pass filters the desired harmonic. Maximum power and optimal shaping is achieved with a resistance 123 connected to a bias voltage. This bias voltage 135 is reflected in a node voltage V(t).

The D.C. component of the node voltage V(t) is directly proportional to the RF input voltage 157. This D.C. component controls YTM efficiency and hence power output at the multiplied frequency. When an RF pulse 157 is applied at the input of the YTM, voltage V(t) 161 rises until it reaches its steadystate value determined by the RF input voltage amplitude and the input resistance. Capacitor C1 121 will charge up to this steady state DC voltage for each pulse applied at the RF input. This description is essentially representative of the prior art.

In the normal course of events, one expects to see pulses at the RF output whose rise and fall times are a function only of the YIG filter bandwidth, which typically is approximately 40 MHz, 3 db bandwidth, to yield rise and fall times of approximately 20 nanoseconds. However, actual measurements of output pulses yield risetimes of up to 160 to 200 nanoseconds. It has been found that C1 121 does not charge as rapidly as predicted by calculating the RC product of the circuit; C1 121 charges much more slowly due to the fact that the SRD 155 has significant reverse recovery current. The forward current through the SRD 155 tends to charge C1 121, while the reverse-recovery current tends to discharge it. The net effect is a lengthening of the total charge time of C1 121. This in turn produces a slow rise of the node potential V(t) and consequently a long risetime for the prior art YTM RF output pulse.

Figure 8:
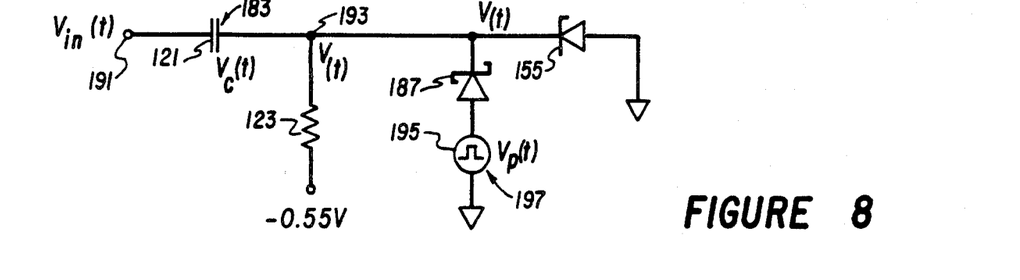

The technique in accordance with the present invention to overcome the long risetime problem is illustrated in FIG. 8. There a pulse is injected through a Schottky diode D2 187 to charge C1 121 to the required final value before the RF pulse arrives. The result is output pulses whose risetime is unaffected by the SRD 155 and hence would only be limited by the filter bandwidth of the YIG or any other tuned circuit that may be used to select th desired harmonic of the input frequency. This can be readily seen by examining FIG. 4, where a simple clamping circuit with an ideal diode is shown. Waveforms of the voltages and current occurring in this circuit are shown in FIGS. 5A-5B. A capacitor 121 is coupled to an ideal diode 125 and a resistor 123 in shunt. The other lead of the resistor 123 is coupled to a voltage source 135 set at a voltage that slightly forward biases the diode 125, e.g., at −0.55 volt. An input microwave pulse with an amplitude of voltage Vin(t) 127 (FIG. 5A) enters the circuit. After passing through the capacitor 121, the signal voltage V(t) 131 (FIG. 5B) has a risetime that is relatively undegraded. The resulting risetime is dependent on the time it takes to charge the capacitor 121 to its steady state voltage. The capacitor 121 is charged by the diode current 133 (FIG. 5C). Since the ideal diode 125 has no reverse recovery current, the voltage Vc(t) 129 across the capacitor 121 (FIG. 5D) reaches its steady state value relatively quickly, namely, on the order of 135 picoseconds, depending on the size of the capacitor and value of the source resistance.

Figure 4:
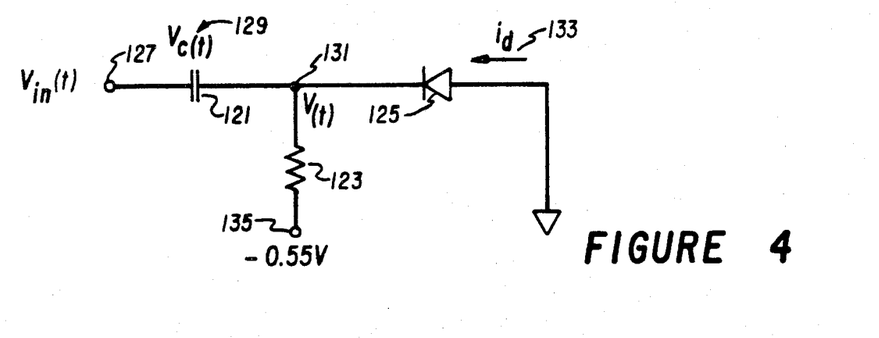
Figure 5A:
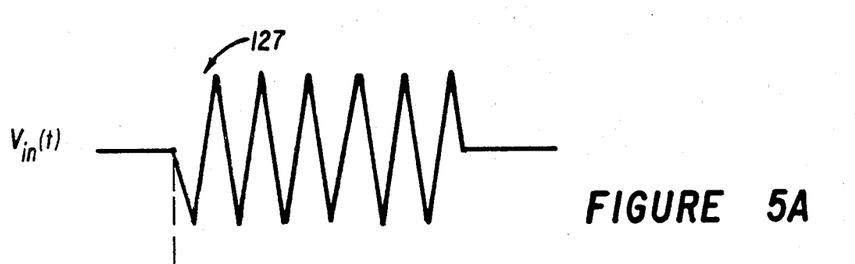
Figure 5B:
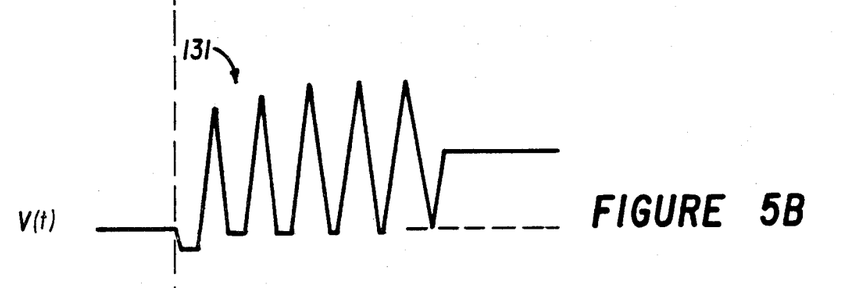
Figure 5C:
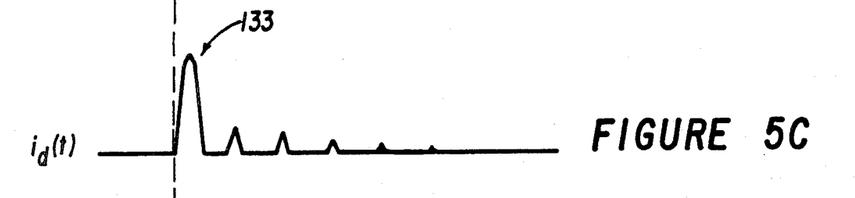
Figure 5D:
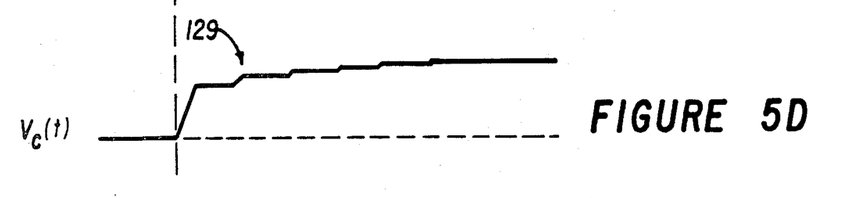
Figure 6:
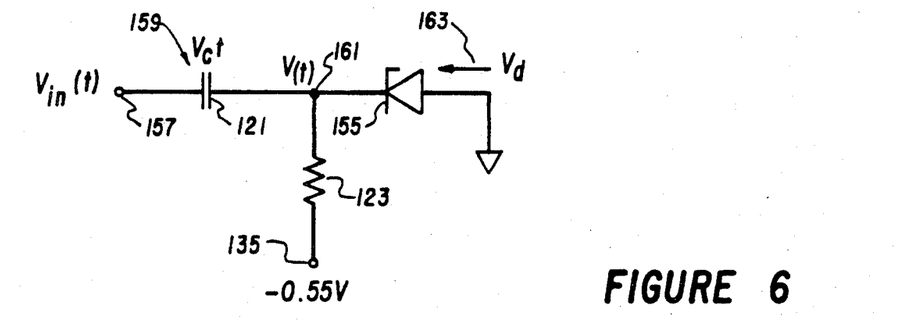
Figure 7A:
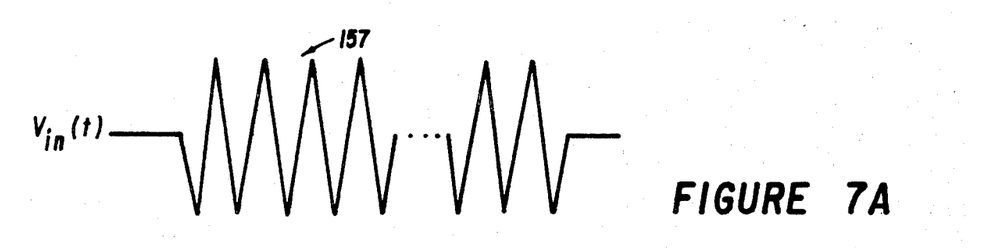
Figure 7B:
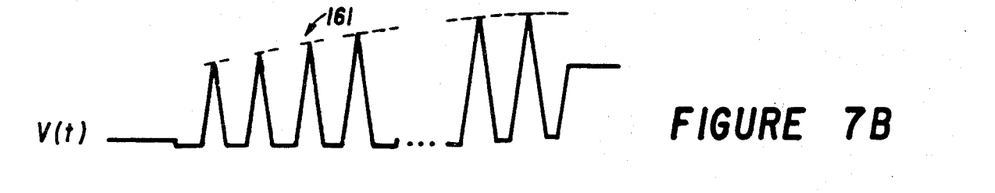
Figure 7C:
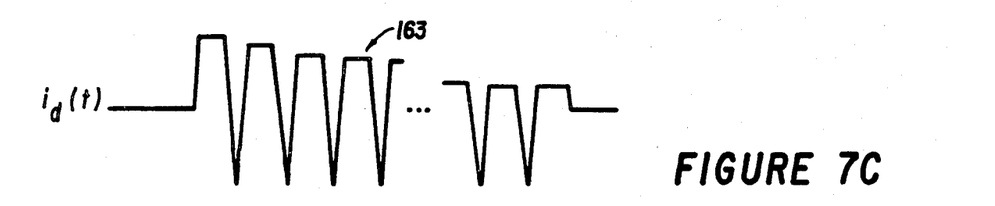
Figure 7D:
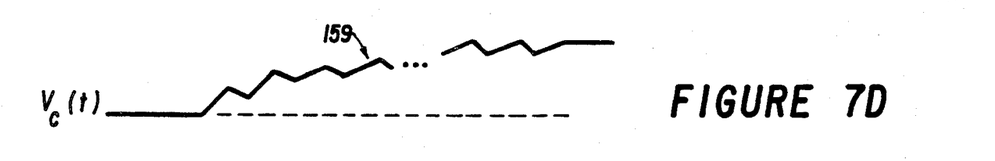

In contrast to this simple circuit is the circuit in FIG. 6, which illustrates the circuit of FIG. 4 altered by replacing the ideal diode 125 with a step recovery diode (SRD) 155. This circuit is also a typical YTM circuit in the prior art. Waveforms of the voltages and current occurring in this circuit are shown in FIGS. 7A-7D. Here, an input microwave pulse with a voltage Vin(t) 157 (FIG. 7A) enters the circuit. After passing through the capacitor 121, the signal voltage V(t) 161 (FIG. 7B) has a risetime much greater than the circuit of FIG. 4. This degraded or increased risetime results from the capacitor 121 taking longer to charge to its steady state value than in FIG. 4. This is because the diode current id(t) 163 (FIG. 5C) has a significant reverse recovery current. The reverse recovery current tends to discharge the capacitor 121 during each alternate half cycle of the microwave input pulse. This causes the voltage Vc(t) 159 across the capacitor 121 (FIG. 7D) to fluctuate, first increasing during diode forward conducting and then decreasing due to diode reverse conduction. In this manner, voltage Vc(t) is significantly slowed down in reaching its steady state value. The risetime of voltage Vc(t) is typically on the order of 100 to 150 nanoseconds, depending on the size of the capacitor, the source resistance, the diode characteristics, the frequency of the input signal, and the amplitude characteristics of the input signal.

Figure 9A:
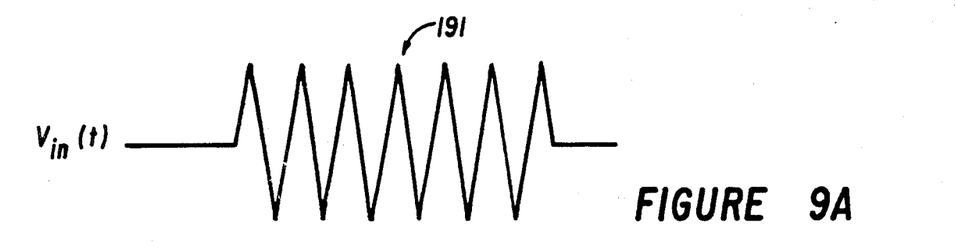
Figure 9B:
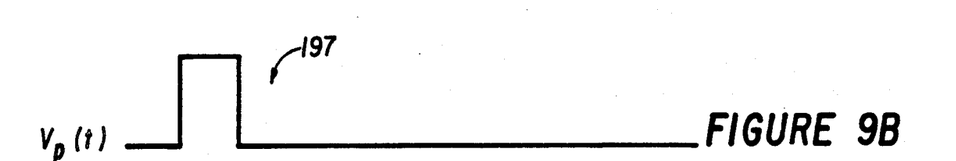
Figure 9C:
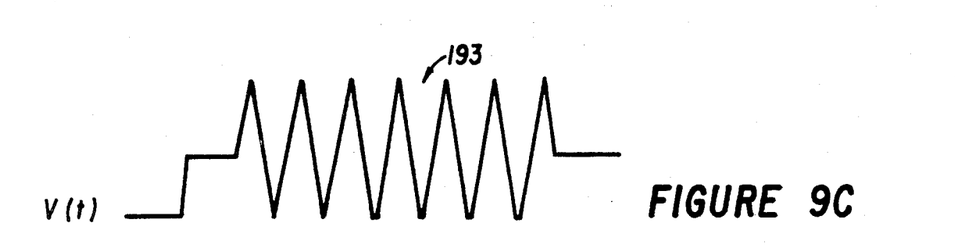
Figure 9D:
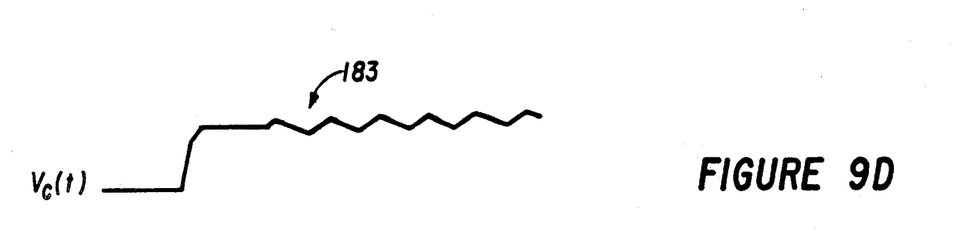

The illustrated embodiment of the invention, shown in FIG. 8, operates as follows. A pulse generator 195 is coupled through a diode 187 to the circuit of FIG. 6 at the cathode of SRD 155. In FIGS. 9A-9D, the waveforms of the voltages occurring in the circuit in FIG. 8 clearly show a marked improvement in risetime when the pulse injection technique in accordance with the preferred embodiment of the invention is used. An input microwave pulse with a voltage Vin(t) 191 (FIG. 9A) enters the circuit. Before it arrives at the capacitor 121, a pulse with a voltage Vp(t) 197 (FIG. 9B) is sent to the capacitor 121. The pulse charges the capacitor 121 to its steady state value. This eliminates the risetime of a voltage V(t) 193 (FIG. 9C) associated with charging the capacitor. FIG. 9D shows the voltage Vc(t) 183 across the capacitor 121 being charged to its steady state values by the pulse with the voltage Vp(t) 197.

Figure 10:
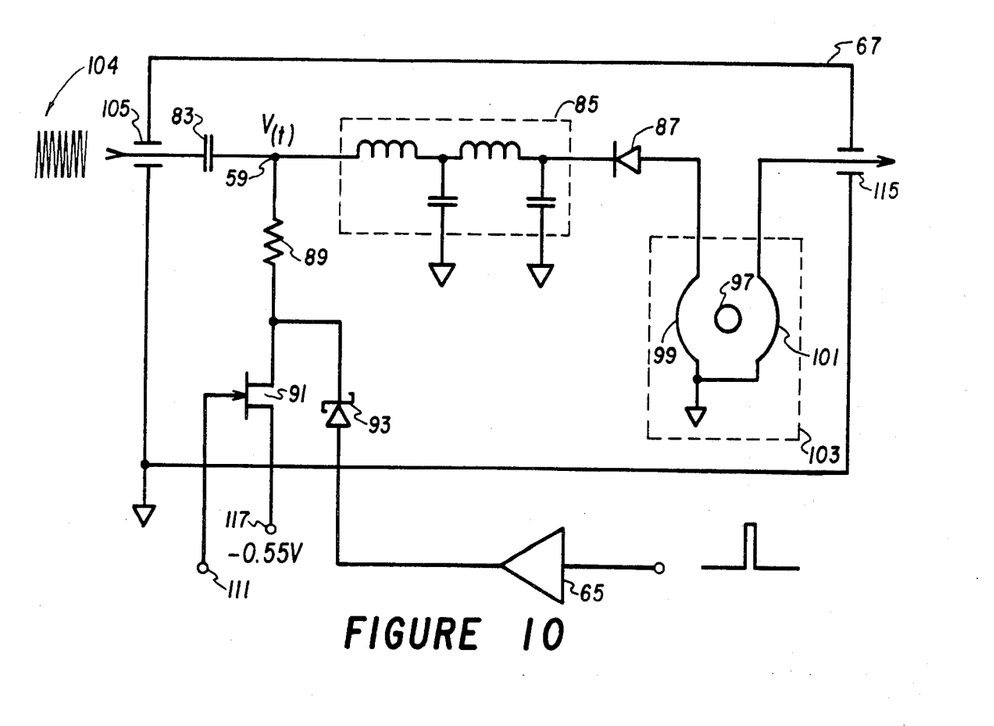
FIG. 10 is a schematic diagram of a YTM with pulse injection in accordance with the preferred embodiment of the invention.

In FIG. 10, a YTM 67 embodying the present invention is set out. An input capacitor 83 is coupled to a matching network 85. The matching network 85 is also coupled to the cathode of an SRD 87. The anode of the SRD 87 is coupled to a harmonic filter 103 comprising a first inductor 99, a YIG sphere 97, and a second inductor 101. The filter is coupled to an output 115 of the system.

In order to slightly forward bias the SRD 87, a resistance 89 is coupled after the capacitor 83 in shunt with the matching network 85. The resistance 89 is coupled to the drain of a field effect transistor (FET) 91, whose source is coupled to a voltage source 117 set at approximately −0.55 volt. The FET 91 acts as a variable resistor. The gate voltage 111 of the FET 91 is varied to vary the shunt impedance for maximum power efficiency of the YTM. The drain of the FET 91 in turn is coupled to the cathode of a Schottky diode 93. The anode of the Schottky diode 93 is coupled to a pulse injection circuit 65.

The YTM 67 acts as a frequency multiplier by filtering out certain higher harmonics of the input signal 104. Microwaves, for instance on the order of 2 GHz to 6.6 GHz, enter the YTM 67 through the input node 105. They pass through the capacitance 83 which blocks any D.C. current. A voltage V(t) 59 is measured at the junction of the capacitance 83 and the matching network 85. After reaching its steady state value, the voltage V(t) 59 varies proportionally with the amplitude of the input signal 104 at the input node 105.

The matching network 85, through which the input signal 104 passes, is designed such that the source impedance of the input signal is matched to the input impedance of the SRD 87. After the matching network, the input signal 104 then passes through the SRD 87, where harmonics of the input signal is generated. When the input signal passes through the SRD 87, the SRD 87 operates in a varactor mode if the signal power is low. In the varactor mode, the SRD 87 exhibits steep variations of capacitance with applied voltage. This capacitance is pumped at the baseband or input frequency rate. The result is a current that is rich in harmonics. If the power is high enough to forward bias the SRD 87, significant diode conduction begins to occur. This causes diode snap-off, which also results in a current rich in harmonics. The harmonics generated by the SRD 87 are then sent through the filter 103 which bandpasses only harmonics with a select frequency. The resulting signal sent to the output 115 is then a selected higher harmonic of the input signal 104, or the input signal 104 multiplied.

Figure 11:
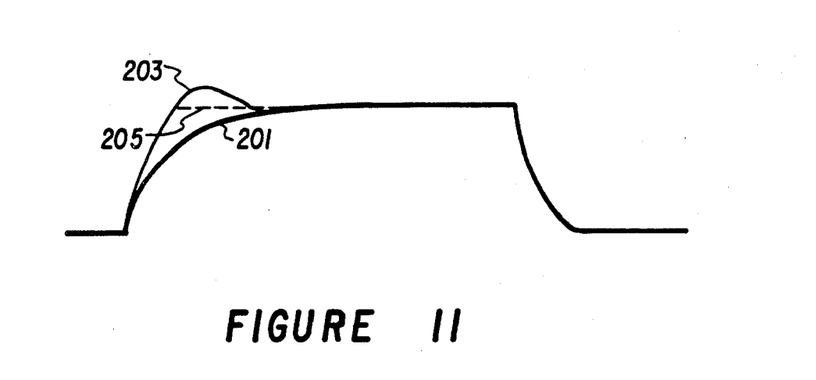
FIG. 11 is a graph of a microwave pulse showing the effect of varying the injected pulse amplitude.
Figure 12:
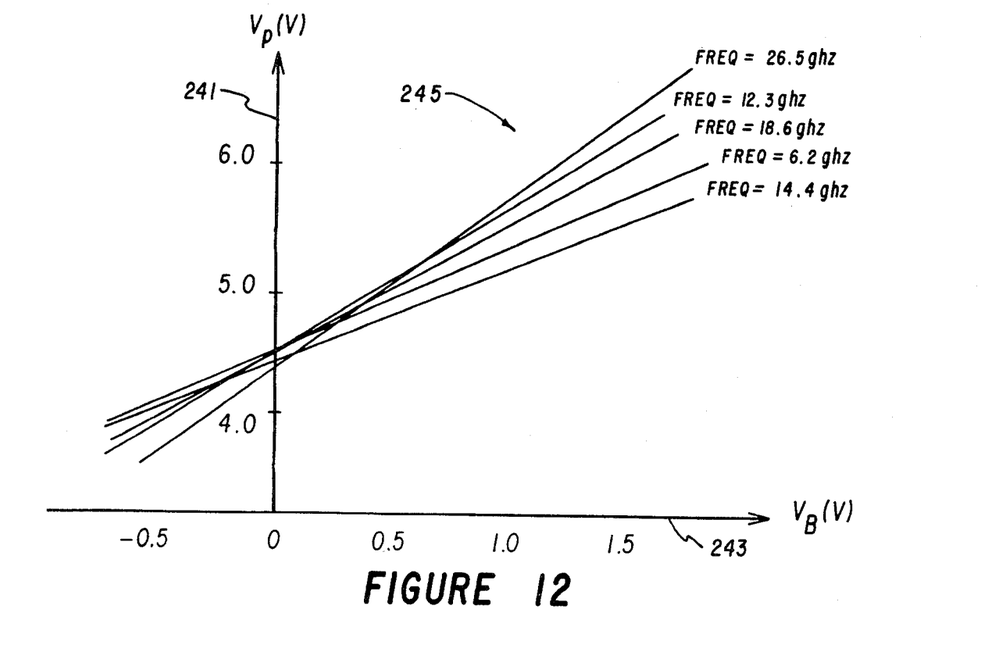
FIG. 12 is a graph which shows the measured optimal YTM pulse injection voltage for a range of microwave frequencies and steady state voltages.

When pulse modulated signals are sent through the YTM 67, their risetime at the output 115 is degraded because of the time it takes to charge the capacitance 83. The increase in time to charge the capacitor 83 is caused primarily by a reverse recovery current through SRD 87. Therefore, a pulse in accordance with the invention injected through the Schottky diode 93 quickly charges the capacitance 83 to its steady state value. This minimizes the time it takes to charge capacitance 83. However, the injected pulse must be of the correct characteristics; FIG. 11 illustrates this need to condition a capacitance with an injected pulse having correct pulse characteristics. Pulse characteristics such as pulse base voltage, that is, the d.c. level of the pulse, pulse duration, pulse amplitude, and pulse position relative to the microwave input pulse are all relevant in determining the correct pulse. For example, for the embodiment shown in FIG. 10, the base voltage, duration, and position of the injected pulse relative to the microwave input pulse are constant while the pulse amplitude is varied. If the pulse amplitude is too small, the capacitance will not charge up to the steady state voltage, and there may be a resulting increase in, or degradation of, the risetime of the microwave envelope 201. If the amplitude of the injected pulse is too large, the microwave envelope 203 will again be distorted, requiring a settling time to achieve the correct output. With an optimal pulse amplitude, there is no risetime or settling time associated with charging the capacitance as shown in microwave envelope 205. FIG. 12 shows a graph of the measured optimal amplitude Vp 241 for selected values of the voltage $V_B$ 243, that is, the steady state value V(t) 59, and input signal frequency 245.

Figure 13:
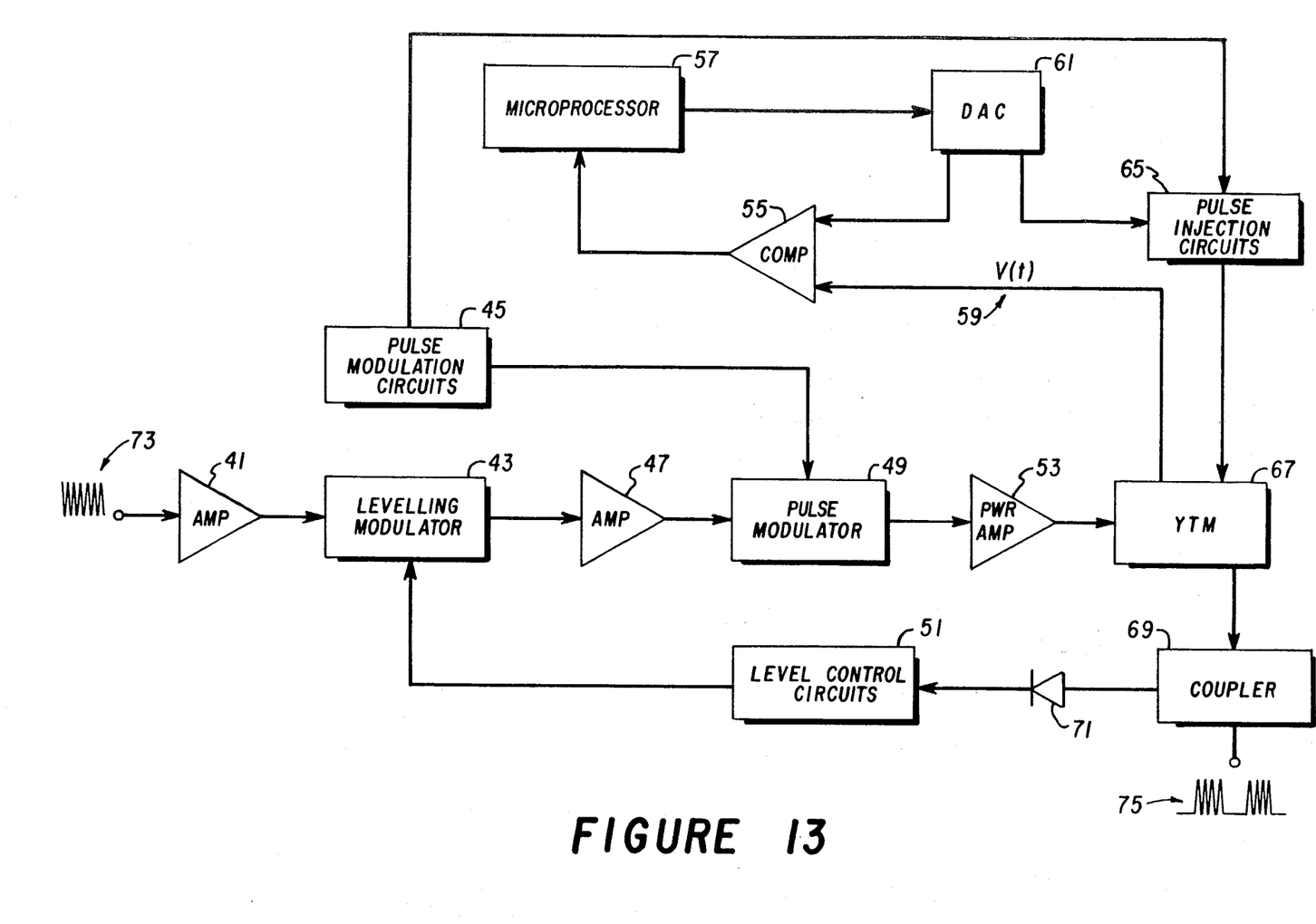
FIG. 13 shows the use of a pulse injection method in accordance with the present invention for eliminating slow output pulse risetime in a pre-multiplication modulation circuit.

A block diagram of a system which embodies the invention is shown in FIG. 13. An amplifier 41 has a microwave signal with a frequency from 2 GHz to 6.6 GHz for an input microwave signal 73. The input signal 73 acts as a carrier wave for pulse modulation and frequency multiplication. The output of the amplifier is coupled to a leveling modulator 43. The leveling modulator 43 takes its input from the amplifier 41 and from the output of a leveling control circuit 51. The leveling control circuit 51 automatically controls the amplitude of the signal, maintaining it at a level set by an operator of the system. In order to do this, the level control circuit 51 receives a feedback signal through a coupler 69 from a microwave output 75, and rectifies it through a detector 71. The signal coming out of the detector gives the amplitude of the microwave output 75. If the amplitude of the microwave output 75 varies from the set level, the leveling control circuit 51 will vary the signal that is sent to the leveling modulator 43 until the amplitude of the microwave output 75 is again at the level set.

The output of the leveling modulator 43 is coupled through a second amplifier 47 to a pulse modulator 49. The second amplifier 47 isolates the leveling modulator 43 from the pulse modulator 49. The pulse modulator 49 modulates the carrier wave signal from the output of the second amplifier 47. This modulation is controlled by a pulse modulation circuit 45.

The output of the pulse modulator 49 is coupled to the power amplifier 53 before it is coupled to YTM 67. Since there is a conversion loss through the YTM 67, the modulated signal is first amplified to compensate for the loss. When the modulated signal goes through the YTM 67, the YTM 67 multiplies its frequency. Thus, the YTM 67 has a microwave signal as an output 75.

Coupled to the YTM 67 are a pulse injection circuit 65. The pulse injection circuit 65 sends a pulse which charges the input capacitance of the YTM to its steady state value. The timing of the pulse injection is controlled by a pulse modulation circuit 45, which signals the pulse injection circuit 65 when a pulse is to be injected. The voltage amplitude of the injected pulse is determined by a voltage value that is stored in a memory, for example, a digital-to-analog converter (DAC) register 61.

In the illustrated embodiment, the steady state value of a YTM bias voltage V(t) 59 is monitored by, for example, a microprocessor 57. The voltage V(t) 59 is compared with the voltage amplitude of the injected pulse by a voltage comparator circuit 55, and the result of the comparison is routed to the microprocessor 57. When the frequency of the input signal 73 changes, the microprocessor 57 switches the circuit into a carrier wave mode. This results in a preliminary microwave signal being passed through the system. The voltage V(t) 59 is allowed to reach its steady state value at this point, the microprocessor 57 then varies the voltage value in the DAC 61 until the value of the voltage held by the DAC 61 is equal to the steady state value of the node voltage V(t) 59. In other words, the node voltage V(t) 59 acts as a reference voltage. When the voltages are equal, the comparator 55 signals the microprocessor so that the value of the voltage presently held in the DAC 61, i.e., the value of the reference node voltage V(t) 59, is used to determine the proper pulse characteristic for pulse injection. After determining the proper pulse characteristic, the microprocessor 57 switches the circuit back to the pulse modulation mode. Using the proper pulse characteristic, the input capacitance of the YTM 67 is then charged to the appropriate steady state voltage prior to each microwave pulse for effecting the minimum risetime in the YTM output.

I claim:

1. A method of minimizing the risetime of a pulse modulated microwave output signal from a frequency multiplier circuit having a capacitance, wherein the risetime is degraded by a delay associated with charging the capacitance to a steady state voltage, comprising the steps of:

injecting a select pulse into the frequency multiplier circuit; and precharging the capacitance to the steady state voltage with the injected select pulse.

2. The method as in claim 1 further comprising the steps of:

passing a preliminary microwave signal through the frequency multiplier circuit;

measuring a reference voltage from the preliminary microwave signal through the frequency multiplier circuit;

determining from the measured reference voltage the pulse characteristics to charge the capacitance to the steady state voltage; and generating the select pulse to have the determined pulse characteristics for the step of injecting the select pulse into the circuit.

3. An apparatus for frequency multiplying a pulse modulated signal comprising:

multiplying means for frequency multiplying the modulated signal;

capacitive means coupled to the multiplying means for blocking any D.C. component of the modulated signal; and pulse injection means coupled to the capacitive means for injecting a pulse into the capacitive means, thereby precharging the capacitive means to minimize the output risetime of the frequency multiplied signal.

4. The apparatus as in claim 3 wherein the capacitive means includes a capacitor.

5. The apparatus as in claim 4 wherein the multiplying means includes a YIG-tuned frequency multiplier.

6. The apparatus as in claim 5 wherein the pulse injection means includes:

first means coupled to the capacitive means for calculating pulse characteristics of the pulse for reaching a steady state voltage of the capacitive means; and second means coupled to the first means and to the capacitive means for providing a pulse with the calculated pulse characteristics for injection into the capacitive means, thereby charging the capacitive means.

7. An apparatus for minimizing the output risetime of a signal passing through a circuit having a capacitance, where the risetime is degraded by a delay associated with charging the capacitance to a steady state voltage, comprising:

first means coupled to the circuit for calculating pulse characteristics to charge the capacitance to a steady state voltage; and pulse injection means, coupled to the first means and to the circuit, for providing a pulse with the calculated pulse characteristics for injection into the circuit, thereby charging the capacitance to the steady state voltage.

8. The apparatus as in claim 7 wherein the first means includes:

second means coupled to the pulse injection means for providing a stored voltage to the pulse injection means;

voltage comparing means, coupled to the circuit and to the second means, for comparing a reference voltage in the circuit with the stored voltage; and third means, coupled to the second means and the voltage comparing means, for modifying the stored voltage.

9. The apparatus as in claim 8 wherein the second means is a digital-to-analog converting register and the third means is a microprocessor.

* * * * *